United States Patent
Schulze et al.

(10) Patent No.: US 9,184,325 B2
(45) Date of Patent: Nov. 10, 2015

(54) SOLAR MODULE SUPPORT FOR COVERING OBLIQUE OBJECT SURFACES WITH HOMOGENEOUS AREA COVERAGE

(71) Applicant: FRAUNHOFER-GESELLSCHAFT ZUR FOERDERUNG DER ANGEWANDTEN FORSCHUNG E.V., Munich (DE)

(72) Inventors: Stefan Schulze, Halle (DE); Heiko Schulze, Halle/Saale (DE)

(73) Assignee: FRAUNHOFER-GESELLSCHAFT ZUR FOERDERUNG DER ANGEWANDTEN FORSCHUNG E.V., Munich (DE)

( * ) Notice: Subject to any disclaimer, the term of this patent is extended or adjusted under 35 U.S.C. 154(b) by 0 days.

(21) Appl. No.: 14/250,424

(22) Filed: Apr. 11, 2014

(65) Prior Publication Data

US 2014/0305050 A1    Oct. 16, 2014

(30) Foreign Application Priority Data

Apr. 12, 2013   (DE) .......................... 10 2013 006 332

(51) Int. Cl.
*H01L 31/042*   (2014.01)
*F24J 2/52*   (2006.01)
*H02S 20/23*   (2014.01)

(52) U.S. Cl.
CPC .............. *H01L 31/0424* (2013.01); *F24J 2/52* (2013.01); *H02S 20/23* (2014.12); *Y02B 10/12* (2013.01)

(58) Field of Classification Search
CPC ......... E04D 1/04; E04D 1/12; H01L 31/0482; H01L 31/0422; H01L 31/0483; Y02B 10/12
USPC .......... 52/173.3, 302.1, 302.3; 126/621, 622, 126/623
See application file for complete search history.

(56) References Cited

U.S. PATENT DOCUMENTS

| | | | | |
|---|---|---|---|---|
| 4,336,413 A | * | 6/1982 | Tourneux ...................... | 136/251 |
| 4,582,953 A | * | 4/1986 | Nagase et al. ................ | 136/259 |
| 4,607,616 A | * | 8/1986 | Lehmann ...................... | 126/669 |
| 5,070,671 A | * | 12/1991 | Fifield et al. .................... | 52/533 |
| 5,108,679 A | * | 4/1992 | Rirsch et al. .................. | 264/118 |

(Continued)

FOREIGN PATENT DOCUMENTS

| | | | | |
|---|---|---|---|---|
| DE | 33 34 926 | | 6/1985 | ............... E04D 1/04 |
| DE | EP 0282718 | * | 9/1988 | ............... E04D 1/04 |

(Continued)

*Primary Examiner* — Brian Glessner
*Assistant Examiner* — Adam Barlow
(74) *Attorney, Agent, or Firm* — Renner Kenner Greive Bobak Taylor & Weber

(57) ABSTRACT

A solar module support for covering oblique object surfaces is disclosed. The solar module support has a lower lying continuous edge area, which acts as a lower overlap area between adjacent solar module supports, which adjoins at an upper edge and a lateral edge. At least one web runs on this edge area which forms a channel for water between the web and the receiving surface. On the underside of the respectively opposite edge, a recess is provided, which has a groove corresponding to the web and which acts as the upper overlap area between adjacent solar module supports. The recess and the groove are dimensioned such that the receiving surfaces lie in the same plane and the web in each case engages in the groove in such a manner that direct contact of the overlap areas is achieved on the web and an interspace remains between the overlap areas.

6 Claims, 5 Drawing Sheets

(56) References Cited

U.S. PATENT DOCUMENTS

| | | | | |
|---|---|---|---|---|
| 5,338,369 | A * | 8/1994 | Rawlings | 136/246 |
| 6,247,284 | B1 * | 6/2001 | Alvarez et al. | 52/553 |
| 6,354,289 | B1 * | 3/2002 | Ridett | 126/622 |
| 7,178,295 | B2 * | 2/2007 | Dinwoodie | 52/173.3 |
| 8,471,141 | B2 * | 6/2013 | Stancel et al. | 136/246 |
| 8,511,006 | B2 * | 8/2013 | Reisdorf et al. | 52/173.3 |
| 8,776,455 | B2 * | 7/2014 | Azoulay | 52/173.3 |
| 2003/0154666 | A1 * | 8/2003 | Dinwoodie | 52/173.3 |
| 2003/0154667 | A1 * | 8/2003 | Dinwoodie | 52/173.3 |
| 2008/0135088 | A1 | 6/2008 | Corrales | 136/246 |
| 2012/0085053 | A1 * | 4/2012 | Barone | 52/302.1 |
| 2013/0136531 | A1 * | 5/2013 | Kobayashi | 403/326 |

FOREIGN PATENT DOCUMENTS

| | | | | |
|---|---|---|---|---|
| DE | 92 18 903 | | 2/1996 | B28B 11/12 |
| DE | 9218903 | * | 2/1996 | E04D 13/18 |
| DE | 20104774 | | 6/2001 | E04D 1/30 |
| DE | 102006038730 | | 12/2007 | E04D 1/12 |
| DE | 1020006038730 | | 12/2007 | E04D 1/12 |
| DE | 102009048086 | | 10/2010 | E04D 1/28 |

* cited by examiner

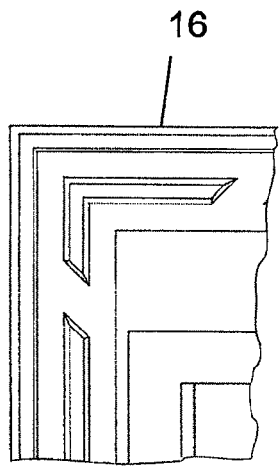
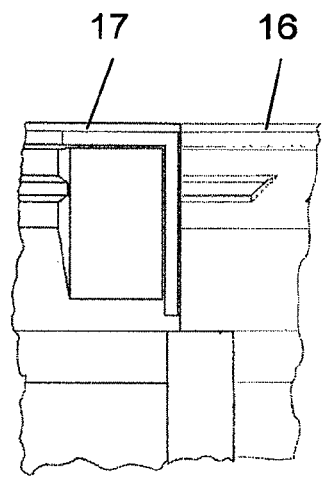
Fig.7A                Fig.7B
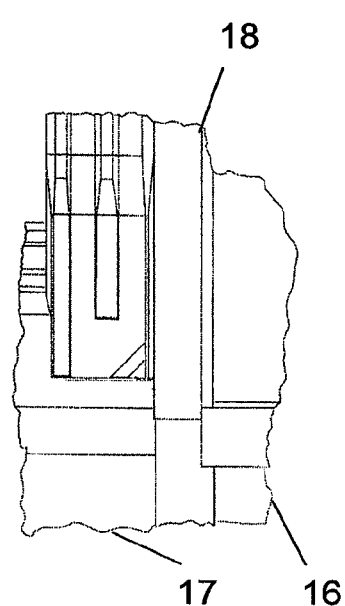
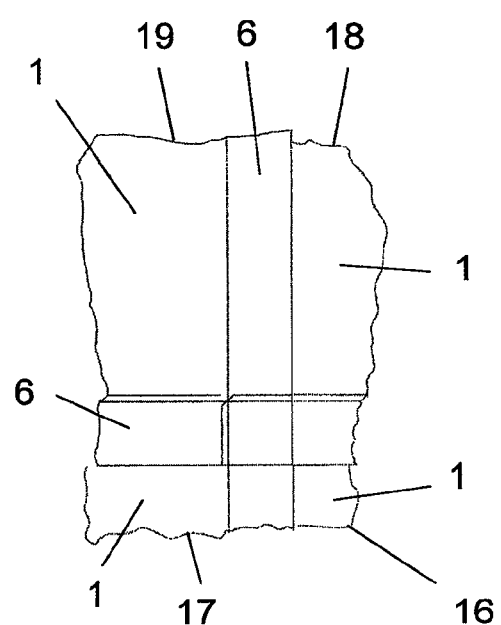
Fig.7C                Fig.7D

SOLAR MODULE SUPPORT FOR COVERING OBLIQUE OBJECT SURFACES WITH HOMOGENEOUS AREA COVERAGE

TECHNICAL FIELD OF APPLICATION

The present invention relates to a solar module support for covering oblique object surfaces, which is formed from a plate-shaped base body having a receiving surface for one or a plurality of solar modules.

PRIOR ART

Solar modules generally have a transparent front consisting of glass or a transparent plastic. The solar cells, embedded in a soft plastic matrix, and the electrical connectors lie underneath. Embedding in a soft, transparent plastic acts to protect the said components from environmental influences and mechanical loads. The rear of the solar modules is usually formed by a thin foil, which is composed of a plurality of individual layers having individual functions. Suitable module supports are necessary for the mechanical stabilisation of the solar modules. For example, it is known to provide solar modules with an aluminium frame in order to give the said composite the necessary stability.

In addition to the use in solar plants, solar modules are also attached to the roofs of buildings or other objects. The solar modules are often fastened to roofs with the aid of corresponding fixing rails, which consist of aluminium, plastic or wood and have to be fixed to the roof tiles. This double coverage of the roof with a tile surface and an additional surface with solar modules is however not sensible, since the tiles cannot be seen under the solar surface and therefore increased loading of the roof truss unnecessarily takes place owing to the high load.

As an alternative to this double coverage, solar modules integrated into the building are known. Rather than being attached to an existing building structure, these are integrated into the latter. The solar modules then replace the roof tiles and must also assume the protective function of the roof, which was previously provided by covering the roof with tiles, in addition to the function of electrical energy generation from sunlight. In this case commercially available concepts using the shingle principle are known, in which the respectively lower lying row of solar modules are overlapped at the top edge by the row of solar modules above in order to achieve reliable water drainage. The overlap allows rain or condensation to flow from the roof ridge down towards the eaves without it being able to penetrate directly under the solar modules and therefore into the roof truss.

The overlap means that not only the overlap region of solar cells must be kept free, but also a free area must be kept under the overlap, since the overlapping solar module can cast a shadow. With conventional electrical interconnection of the solar cells, partial shading of solar cells on the one hand results in a reduction in the output of the entire system, since the power of the weakest member is definitive for the total power of the system. On the other hand, photovoltaic systems in this shingle design have a lower area use potential, since the regions not occupied with solar cells do not fulfil an electrical function.

The object of the present invention consists in providing a solar module support that is suitable for integrated roofing and allows homogeneous area coverage with solar modules.

DESCRIPTION OF THE INVENTION

The object is achieved with the solar module support according to patent claim 1. Advantageous configurations of the solar module support are the subject matter of the dependent patent claims or can be drawn from the following description as well as from the exemplary embodiment.

The proposed solar module support for covering oblique object surfaces, in particular for forming building roofs, is formed as a base element from a plate-shaped base body having an upper side and an underside. The base body has on the upper side a receiving surface for one or a plurality of solar modules, to which a lower lying continuous edge area, which acts as a lower overlap area between adjacent solar module supports, adjoins at an upper edge and at one of the two lateral edges of the base body, referred to below as the first lateral edge. The upper edge of the base body relates to the installation position of the solar module support on an oblique object surface, the two lateral edges forming the left and right edges. At least one web runs on the edge area along the upper and first lateral edges of the base body, by means of which web a channel for draining water is formed between the web and the higher lying receiving surface. At the lower edge opposite the upper edge and at the second lateral edge opposite the first lateral edge, the base body has a recess with a groove corresponding to the web on the underside underneath the receiving surface. This recess with groove acts as upper overlap area between adjacent solar module supports. The recess and the groove are dimensioned such that when the upper and lower overlap areas of adjacent solar module supports overlap, the receiving surfaces of the adjacent solar module supports lie in the same plane and the web in each case engages in the groove in such a manner that firstly direct contact of the overlap areas is achieved on the web and secondly an interspace remains between the overlap areas in the region between the web and the receiving surface, which allows water to flow through along the web. Adjacent solar module supports mean the solar module supports that adjoin on an oblique object surface at the upper edge, at the lower edge, at the left-hand edge and/or at the right-hand edge. The width of the lower lying edge area is preferably between 5 and 20 cm.

The proposed solar module support allows an integrated building roof, which offers an aesthetically appealing, homogeneous appearance of the roof owing to the arrangement of the solar modules in the same plane. The solar module, a laminate consisting of a transparent front and the solar cells embedded in a soft polymer matrix, is attached to the receiving surface of the solar module support provided for the purpose. The particular configuration of the upper and lower overlap areas means that the receiving surfaces and therefore also the solar modules situated thereon lie in the same plane and therefore produce an aesthetically appealing overall appearance. The direct contact between the upper overlap area and the upper side of the web of the lower overlap area achieves sufficient sealing of the water-conducting edge areas in order to prevent water penetrating into regions below the solar module supports. The interspace remaining in this case between the web and the receiving surface allows water to flow through on the one hand and on the other hand provides enough play to compensate seasonal variations in the expansion and contraction of the roof truss on which the solar module supports are preferably mounted.

For this purpose, the solar module supports are preferably merely inlaid with appropriate holders or clamps onto the existing roof laths. The holders are in this case attached suitably on the underside of the solar module support. The installation effort is greatly reduced by simply hanging the supports onto the roof laths, since it is not necessary to install an additional substructure.

In a preferred configuration, a second web also runs on the edge area along the upper and first lateral edges of the base body between the first web and the receiving surface. The recess on the underside at the respectively opposite edges of the base body then has a second groove corresponding to the second web. The second web preferably has one or a plurality of gaps or interruptions, at least along the upper edge, which allow water to pass through.

The receiving surface is preferably enclosed by a raised region both towards the first and second lateral edges and towards the upper and lower edges of the base body. This raised region preferably forms an end web at the upper and first lateral edges and a raised covering strip at the lower and second lateral edges, which cover the butt join between the adjacent solar module supports when the upper and lower overlap areas of adjacent solar module supports overlap. The height of the end webs is preferably selected to be such that it corresponds at least to the thickness of the solar modules to be attached to the receiving surface. The covering strips must have a greater height from the start in order to be able to cover the butt join between the adjacent solar module supports. The boundary between the receiving surface and the first lateral edge preferably also has a further raised, continuous web above the end web, which forms a drainage edge or overflow spout, which, when water flows over the roof surface, conveys the water downwards along the said edge or spout.

The proposed solar module support can be used advantageously primarily for integrated building roofs. However, attachment to oblique surfaces of other objects is of course also possible if there is a corresponding demand for this. The fastening of the solar module support can take place both using existing roof laths, for example with the above-mentioned holders or clamps, and using other holding mechanisms known to a person skilled in the art. The type of fastening does not form the subject matter of the present patent application.

The solar module support is preferably produced in a lightweight design. It can consist for example of fibre-reinforced or non-reinforced plastics, in particular thermoplastics or duroplastics, or else of a metallic material. The base body can in this case be formed from a single part or from an upper part and a lower part, which are connected to each other for example by means of an adhesive bonding or lamination process. The support can be shaped using an injection moulding method if thermoplastic materials are used. The support can also be shaped using a resin transfer moulding (RTM) method, in which a fibre mesh is placed into a mould and then cast with a thermosetting resin system under vacuum and pressure. In an open mould, the supports can also be produced by manual lamination methods, in which the fibre inlay is impregnated with resin and inserted manually. The support can also be produced by a vacuum bagging method, by applying a plastic bag and then evacuating it. The compression moulding method or the sheet moulding compound (SMC) method are also suitable as economical methods for high-volume production. In this case resin-impregnated fibre mats or plates are first fabricated, heated and then compressed in a mould. The resin then crosslinks under increased temperature and the support can then be removed. Standard presses, which contain a positive and a negative die, which are closed and thus make shaping possible, are suitable for compression in the mould. Furthermore, compression by means of diaphragms is suitable. In this case only a positive mould is needed; the deformable SMC material is pressed into the cavity by means of a flexible membrane and cures.

The actual photovoltaic module or solar module having a transparent front screen and the solar cells and cross connectors embedded in a plastic matrix can be attached to the receiving surface for the solar module using a moulding method or preferably using a vacuum lamination method. A connection socket and other electrical components such as cables, power inverters or monitoring technology for the functioning of the solar module can be integrated into the base body of the support.

SHORT DESCRIPTION OF THE DRAWINGS

The proposed solar module support is explained again in more detail below using an exemplary embodiment in connection with the drawings. In the figures:

FIGS. 7A, 7B, 7C and 7D show an example of the step-by-step superposition of the solar module supports during coverage of a roof.

WAYS OF REALISING THE INVENTION

Figure 1:
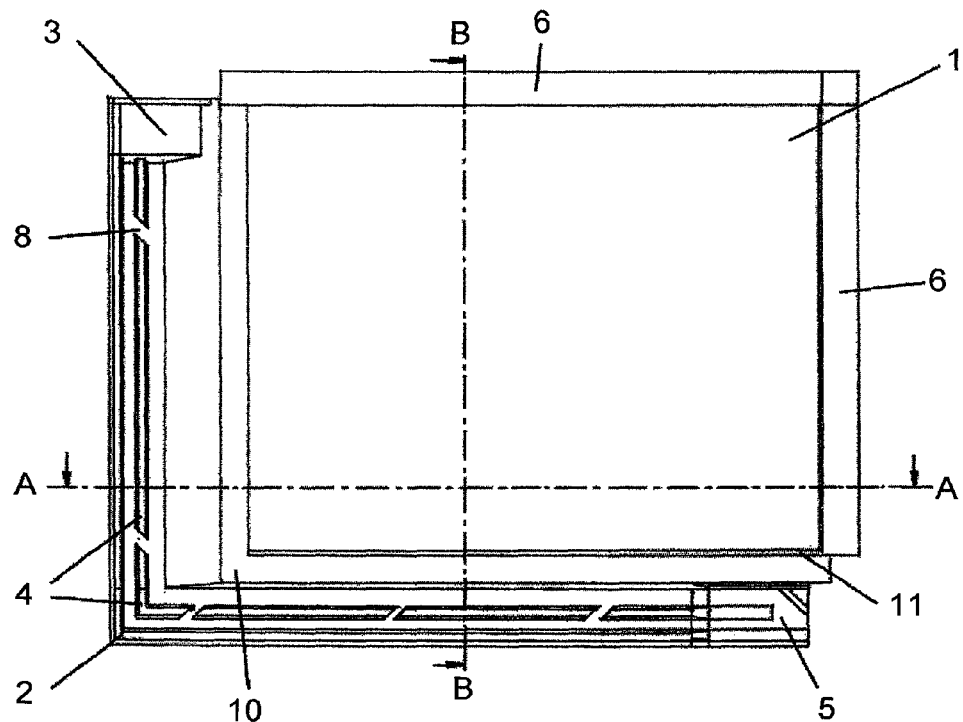
FIG. 1 shows a plan view of a solar module support according to the present invention.

The proposed solar module support is shown in a possible configuration in a plan view in FIG. 1. The left-hand side of the figure is in this case the upper edge, the right-hand side is the lower edge, the upper side is the right-hand edge and the lower side is the left-hand edge of the solar module support during installation on an oblique object surface. In the present example, the first lateral edge of the above description corresponds to the left-hand edge of the solar module support. Of course, the solar module support could also be constructed in such a manner that the first lateral edge corresponds to the right-hand edge.

In FIG. 1, the base body of the solar module support having the receiving surface 1 for one or a plurality of solar modules can be seen. The upper edge of a photovoltaic laminate or solar module attached to the said receiving surface 1 then adjoins with the lateral end web 10. The higher lying covering strips 6, which cover the butt join between adjacent solar module supports and solar modules on the right and on the bottom act as a further delimitation of the receiving surface 1. They act to prevent water penetrating between adjacent solar modules. To the left of the receiving surface runs the overflow spout 11, which, when water flows over the roof surface, conveys the water downwards along the spout. The end webs 10 and the overflow spout 11 cannot prevent 100% of the water from penetrating into the butt join between adjacent solar modules, but only minimise the amount of water. The solar module supports that are adjacent to each other in a roof therefore overlap each other by means of overlap areas. The lower overlap areas 2 lie lower than the end webs 10 and the solar module. They have webs 4, along which the penetrating water can flow. Web interruptions 8 prevent blockages or collections of water, in particular for the horizontal webs at the upper edge of the support. The lower overlap areas 2 are delimited on one side by an upper overflow protection means 3, which prevents water flowing out to the side and at the same time forms an overlap and therefore a transition to the solar module support lying immediately to the right. Furthermore, the lower overlap area 2 running at the side is delimited towards the bottom by an overlap end 5, which is higher than the actual overlap area and provides a transition to the solar module lying immediately below, along which draining water can flow.

Figure 2A:
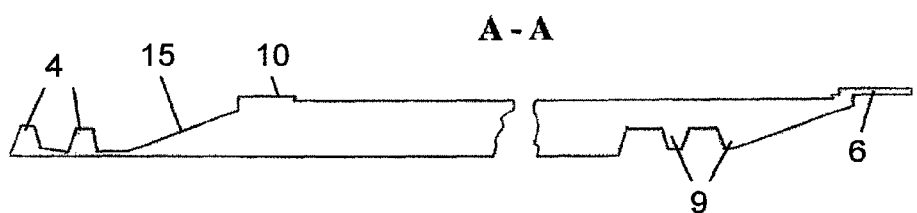
FIG. 2A shows a cross section through the solar module support of FIG. 1 along section planes A-A.
Figure 2B:
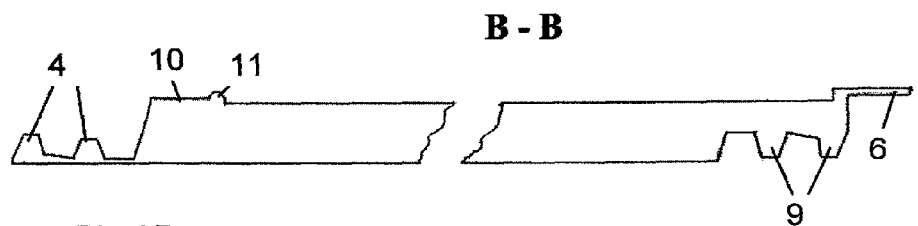
FIG. 2B shows a cross section through the solar module support of FIG. 1 along section planes B-B.

FIGS. 2A and 2B show a cross section of such a solar module support along the section planes A-A and B-B shown in FIG. 1. In the illustration of FIG. 2A, the left-hand side corresponds to the upper edge and the right-hand side corresponds to the lower edge of the solar module support. The webs 4 on the lower overlap areas 2 are lower than the receiving surface 1 for the solar modules and therefore necessarily also lower than the end web 10. A recess is formed on the underside of the solar module support on the lower edge, which recess forms two grooves or upper webs 9, which act as a counterpiece to the webs 4 on the lower overlap area 2 and are placed into the latter when the solar module supports are installed. This recess on the underside forms the upper overlap area. The covering strips 6 on the lower edge and on the right-hand side of the base body form the end and cover the butt join of the respectively adjacent module. FIG. 2A also shows the flat running drainage edge 15, the gradient angle of which must be smaller than the roof gradient in order to prevent an accumulation of downwardly flowing water. FIG. 2B shows the corresponding sectional view in section direction B-B, the left-hand side corresponding to the left-hand edge and the right-hand side corresponding to the right-hand edge of the base body. In this illustration, the overflow spout 11 can also be seen again projecting in relation to the end web 10.

Figure 3A:
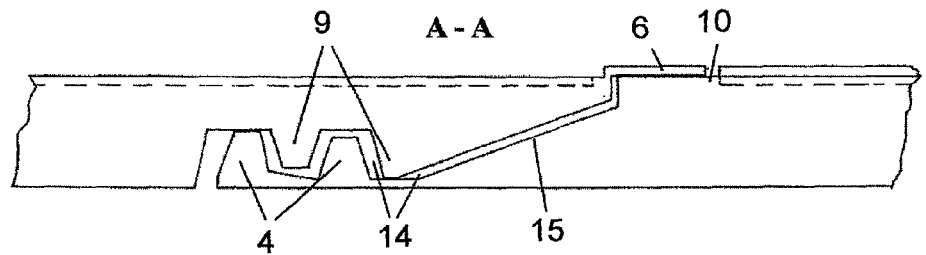
FIG. 3A shows a schematic illustration of the overlap between adjacent solar module supports in cross section along section planes A-A of FIG. 1.
Figure 3B:
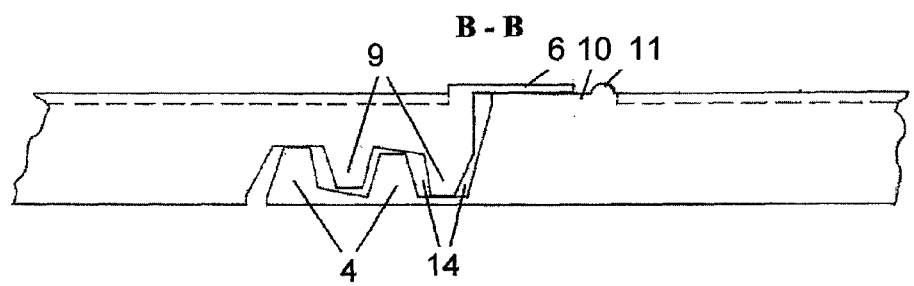
FIG. 3B shows a schematic illustration of the overlap between adjacent solar module supports in cross section along section planes B-B of FIG. 1.

The overlap of the adjacent solar module supports is illustrated again in the corresponding part FIGS. 3A and 3B on the basis of the sectional views of the section planes A-A and B-B of FIG. 1. In section A-A (FIG. 3A), the lower edge of the upper solar module support is shown, which engages with its upper webs 9 or grooves into the webs 4 of the solar module support lying below it. The covering strip 6 covers the butt join between the adjacent supports. In the transverse direction (section B-B; FIG. 3B), it becomes clear how the upper webs 9 or grooves of the left-hand solar module support engage into the webs 4 of the adjacent, right-hand support. The covering strip 6 also forms the end in this case. The upper overlap area lies in each case directly on the upper side of the outer web 4 of the lower overlap area in order to prevent water from flowing out under the solar module support. The upper side of the said outer web has in this example a polygonal cross section having a flat upper side, but can also have a rounded cross section.

FIGS. 3A and 3B also show the cavities 14 between the upper overlap area and the lower overlap area, which act for the drainage of penetrating water and allow ventilation of the interspaces between the webs for drying and for the prevention of condensation. Penetrating water flows via the drainage edge 15 to the webs 4 in order to flow out via the cavities 14.

Figure 4:
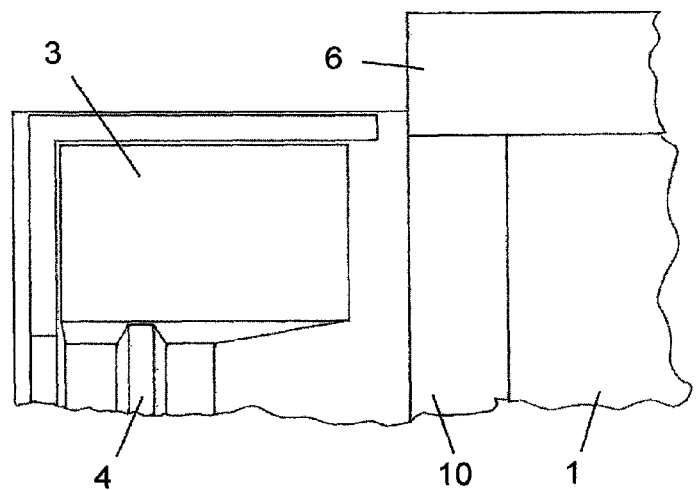
FIG. 4 shows a detail view of the solar module support of FIG. 1 in the region of the overflow protection means.

FIG. 4 shows a detail of the solar module support of FIG. 1, in which the overflow protection means 3 at the upper right-hand edge of the solar module support can be seen more clearly. This overflow protection means 3 acts to prevent water from flowing out of the channels formed between the webs towards the right-hand side of the solar module support.

Figure 5A:
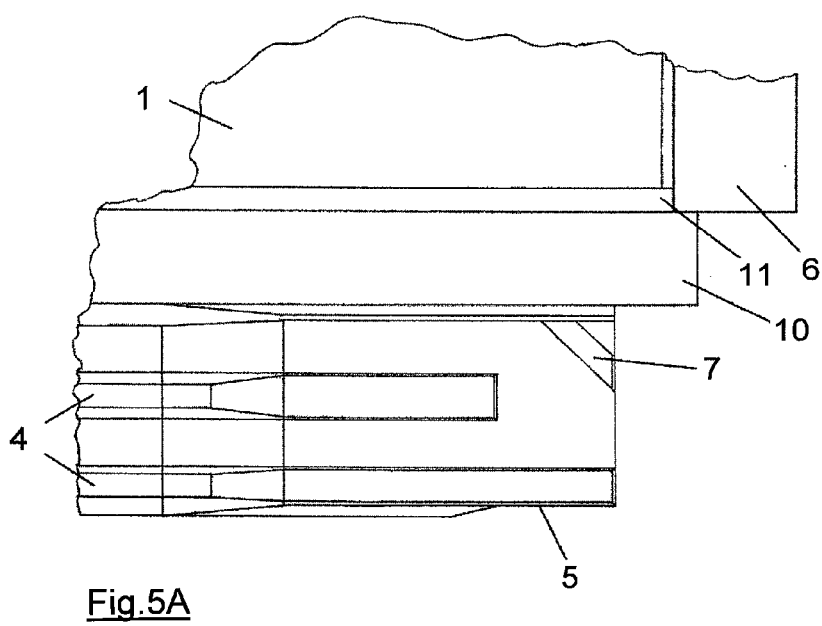
FIG. 5A shows a detail view of the solar module support of FIG. 1 in the region of the overlap end in plan view.
Figure 5B:
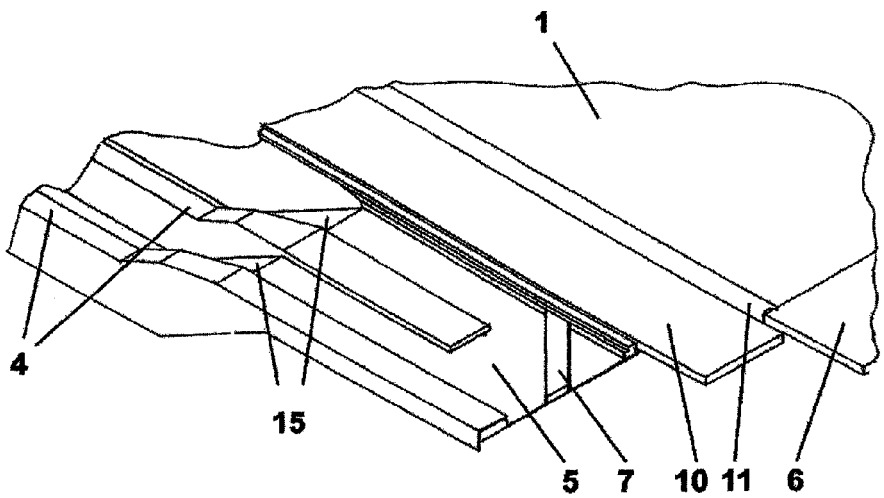
FIG. 5B shows a detail view of the solar module support of FIG. 1 in the region of the overlap end in isometric view.

FIGS. 5A and 5B show a detail view in the region of the overlap end 5, i.e. at the left lower edge of the solar module support of FIG. 1 in plan view (FIG. 5A) and in ISO view (FIG. 5B). This overlap end 5 likewise forms a raised region, which results in water that flows down between the webs in the left-hand edge region flowing onto the surface of the solar module support below and thus via the drainage edge 15 in turn into the corresponding water channel. The water channel 7 is also provided for this purpose.

Figure 6:
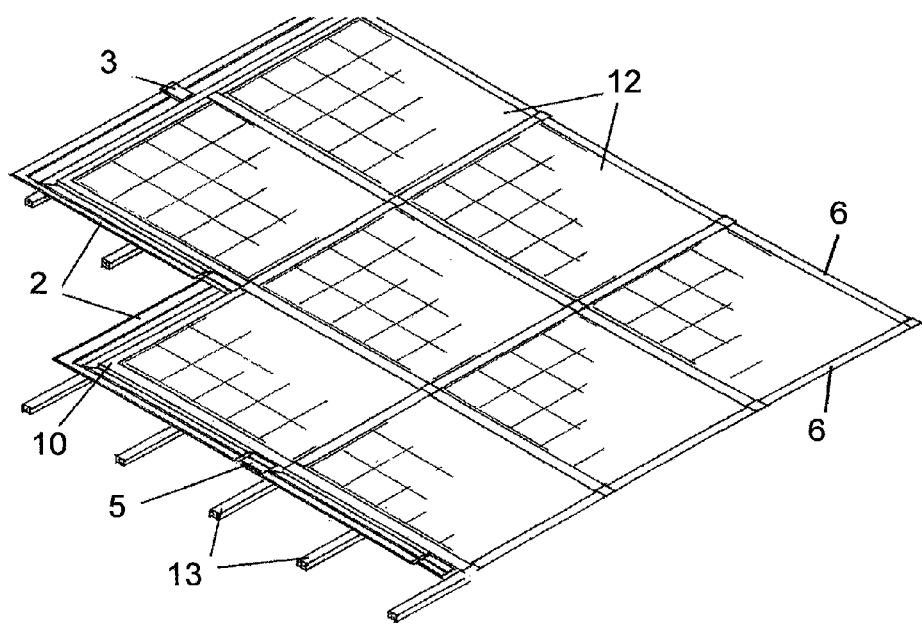
FIG. 6 shows a schematic illustration of the coverage of a roof with the proposed solar module supports.

FIG. 6 shows a schematic illustration of the coverage or partial coverage of a roof with overlapping solar module supports on roof laths 13. The solar module supports are in this case covered with solar modules 12. The Figure shows some of the lower overlap areas 2, the respective overflow protection means 3, the overlap end 5 situated above and the covering strips 6 and end webs 10. The corner regions of the solar module supports each overlap by means of the corner region of the overlap areas 2, of the overflow protection means 3, of the overlap end 5 and the corner region of the covering strips 6.

FIGS. 7A-7D show in the four partial views an example of the step-by-step superposition of the solar module supports during coverage of a roof. FIG. 7A shows the upper left edge of a first solar module support 16, which is partially covered on the left-hand side by a second solar module support 17 according to FIG. 7B, the upper right edge of which can be seen in the figure, when a roof is covered. Then a third solar module support 18 is placed above the first solar module support 16, the lower left edge of which is shown in FIG. 7C. FIG. 7D then shows the plan view after placing a fourth solar module support 19 above the second solar module support 17. Then only the receiving surfaces 1 for the solar modules and the covering strips 6 are still visible owing to the coverage of the individual solar module supports, as in FIG. 6.

REFERENCE LIST

1 Receiving surface for solar modules
2 Lower overlap area
3 Overflow protection means
4 Webs
5 Overlap end
6 Covering strips
7 Water channel
8 Web interruption
9 Upper webs or grooves
10 End web
11 Overflow spout
12 Solar modules
13 Roof laths
14 Cavities
15 Drainage edge
16 First solar module support
17 Second solar module support
18 Third solar module support
19 Fourth solar module support

The invention claimed is:

1. A solar module support for covering oblique object surfaces, which is formed from a plate-shaped base body having an upper side and an underside,
   which has a receiving surface for one or a plurality of solar modules on the upper side,
   to which a lower lying continuous edge area, which acts as a lower overlap area between adjacent solar module supports, adjoins at an upper edge and at a first lateral edge of the base body, wherein at least one web runs on the edge area along the upper and first lateral edges of the base body, by means of which web at least one channel for draining water is formed between the web and the receiving surface, and which has a recess having a groove, wherein the recess acts as an upper overlap area between adjacent solar module supports, on the underside on a lower edge opposite the upper edge and on a second lateral edge opposite the first lateral edge underneath the receiving surface, wherein the recess and the groove are dimensioned and arranged such that when the upper and lower overlap areas of a like solar module support positioned adjacent the solar module support adjoins at the upper and lower edge and at the first and second lateral edge overlap, the receiving surfaces of said like solar module support lies in the same plane and the web in each case engages in the groove in such a manner that direct contact of the overlap areas is achieved on the web and an interspace remains between the overlap areas in the region between the web and the receiving surface, which allows water to flow through along the web, wherein the edge area running at the upper edge has an overflow protection means on the side adjacent to the second lateral edge, which means prevents water running to the side out of the channel formed by the web, and wherein the edge area running on the first lateral edge has an overlap end on the side adjacent to the lower edge, said overlap end raising above the overflow protection means of a solar module support adjoining the lower edge and allowing water to flow via the channel onto the surface of the solar module support adjoining the lower edge.

2. The solar module support according to claim 1, characterised in that at least one second web runs along the upper and first lateral edges of the base body on the edge area between the first web and the receiving area, and the recess on the underside has a second groove arranged such that when the upper and lower overlap areas of adjacent solar module supports overlap, the second web in each case engages the second groove.

3. The solar module support according to claim 2, characterised in that the second web has interruptions, which allow water to pass through, at least in the region of the upper edge of the base body.

4. The solar module support according to claim 3, characterised in that the receiving surface is delimited at the upper and first lateral edges by an end web.

5. The solar module support according to claim 4, characterised in that the receiving surface is delimited at the lower and second lateral edges by raised covering strips, which cover a butt join between the adjacent solar module supports when the upper and lower overlap areas of adjacent solar module supports overlap.

6. The solar module support according to claim 5, characterised in that the receiving surface also has an overflow spout along the end web on the first lateral edge.

* * * * *